(12) United States Patent
Kanamaru et al.

(10) Patent No.: US 6,496,023 B1
(45) Date of Patent: Dec. 17, 2002

(54) SEMICONDUCTOR-DEVICE INSPECTING APPARATUS AND A METHOD FOR MANUFACTURING THE SAME

(75) Inventors: Masatoshi Kanamaru, Miho (JP); Yoshishige Endo, Tsuchiura (JP); Takanorr Aono, Chiyoda (JP); Ryuji Kohno, Chiyoda (JP); Toshio Miyatake, Chiyoda (JP); Hideyuki Aoki, Takasaki (JP); Naoto Ban, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/722,484

(22) Filed: Nov. 28, 2000

(30) Foreign Application Priority Data

Sep. 6, 2000 (JP) ........................................ 2000-274997

(51) Int. Cl.[7] .............................................. G01R 31/02
(52) U.S. Cl. ...................... 324/754; 324/762; 324/761; 324/537; 324/158.1
(58) Field of Search ................................ 324/757, 762, 324/754, 758, 761, 158.1, 537

(56) References Cited

U.S. PATENT DOCUMENTS

| | | | | | |
|---|---|---|---|---|---|
| 5,172,050 A | * | 12/1992 | Swapp | ........................ | 324/762 |
| 5,811,982 A | * | 9/1998 | Beaman et al. | .............. | 324/762 |
| 6,020,747 A | * | 2/2000 | Bahns et al. | ................. | 324/754 |
| 6,084,420 A | * | 7/2000 | Chee | ........................... | 324/754 |
| 6,114,864 A | * | 9/2000 | Soejima et al. | .............. | 324/754 |
| 6,181,144 B1 | * | 1/2001 | Hembree et al. | ............ | 324/754 |
| 6,200,143 B1 | * | 3/2001 | Haba et al. | .................... | 439/70 |
| 6,239,590 B1 | * | 5/2001 | Krivy et al. | .............. | 324/158.1 |
| 6,310,484 B1 | * | 10/2001 | Akram et al. | ................ | 324/754 |

FOREIGN PATENT DOCUMENTS

| | | |
|---|---|---|
| JP | A-1-150863 | 5/1969 |
| JP | A-8-75758 | 3/1996 |

* cited by examiner

*Primary Examiner*—N. Le
*Assistant Examiner*—T. R. Sundaram
(74) *Attorney, Agent, or Firm*—Antonelli, Terry, Stout & Kraus, LLP

(57) ABSTRACT

A structure is provided such that a plural cantilevers are formed on a first board formed of silicon, probes are respectively formed on the individual cantilevers at positions each offset perpendicularly to a longitudinal center line of the cantilever, and wiring connected continuously from each probe to a secondary electrode pad portion through an insulating layer. A structure is alternatively adopted such that by using a both-ends supported beam formed of silicon as the beam, each probe is formed at a position offset toward a supported portion side of the both-ends supported beam.

12 Claims, 9 Drawing Sheets

FIG. 7
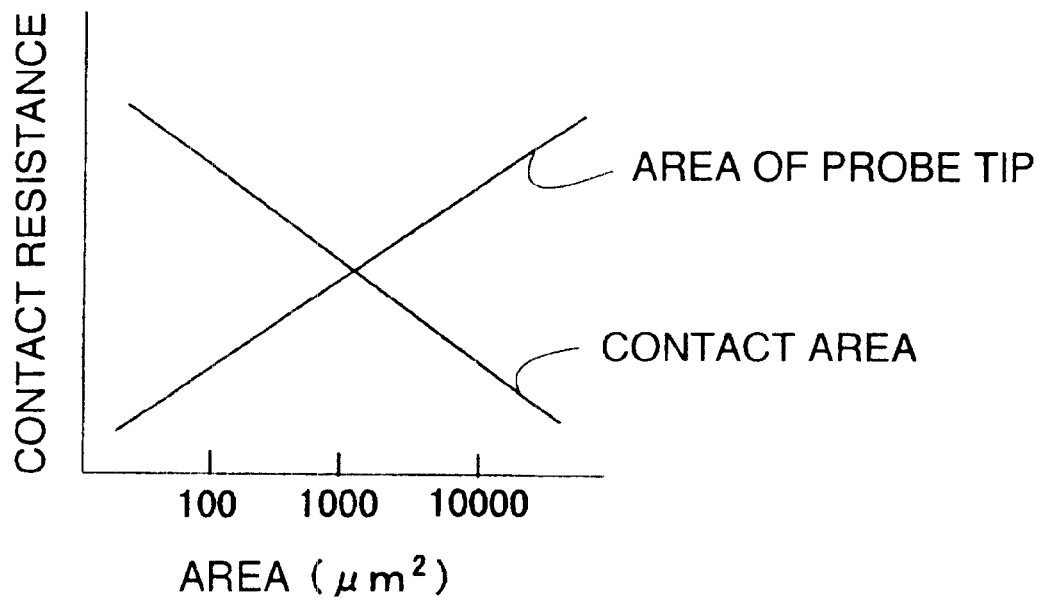
FIG. 8A  FIG. 8B
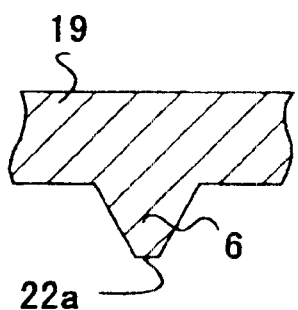
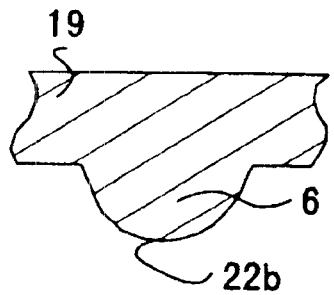

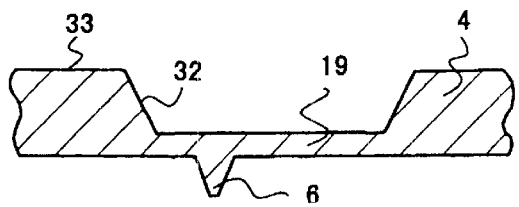
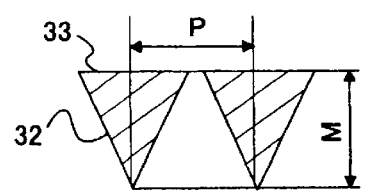
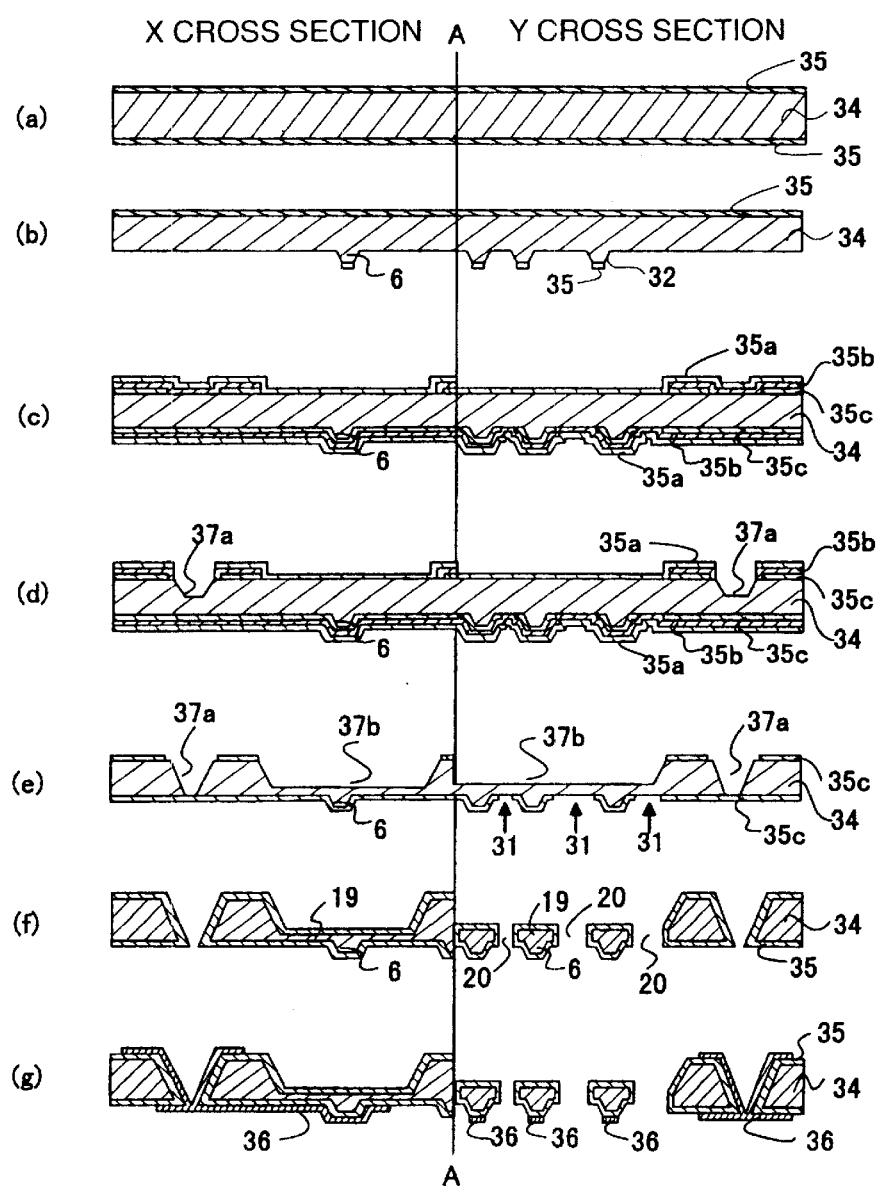

SEMICONDUCTOR-DEVICE INSPECTING APPARATUS AND A METHOD FOR MANUFACTURING THE SAME

BACKGROUND OF THE INVENTION

The present invention relates to a method for testing semiconductor devices, and more particularly to a semiconductor-device inspecting apparatus for attaining high reliability and high yield and a method for inspecting electrical characteristics of semiconductor devices by efficiently inspecting the electrical characteristics of the semiconductor devices in the process of manufacturing semiconductor devices such as in probing inspection and burn-in inspection which is performed in a wafer state.

The process of manufacturing semiconductor devices such as ICs and LSIs is largely classified into a so-called earlier process up until the formation of integrated circuits on a silicon wafer surface and a so-called later process in which this silicon wafer is cut into individual chips which are then encapsulated in a resin, a ceramic or the like.

In these semiconductor devices, inspection of the electrical characteristics of each circuit is performed in a predetermined stage during the earlier process, and a determination of non-defective products and defective products is made in chip units.

The aforementioned electrical characteristic inspection can be largely classified into the probing inspection in which whether electrical continuity between circuits is good or bad is determined, the burn-in inspection in which failures are checked under acceleration by imparting thermal and electrical stresses to the circuits at a high temperature of 150° C. or thereabouts, and the final inspection in which inspection is finally performed by high frequency. Particularly in the final inspection which is performed by high frequency, there has been a demand for an inspection system of high-speed operation in which inspection of high-speed devices is performed by ultra high frequency.

In all of the aforementioned various inspecting methods, their basic connecting means for connecting a subject wafer or a subject chip and an external inspection system are similar. Then, a method is adopted in which very small electrically conductive probes are mechanically pressed against respective electrode pads which are made of an aluminum alloy or other alloy, which are patterned on the subject wafer with pitches of several dozen to a hundred and several dozen microns, and which are several dozen to a hundred and several dozen microns square ($\mu m^2$) and about one micron ($\mu m$) thick. For example, in a case where tungsten probes with tips having a curvature of 20 microns ($\mu m$) or thereabouts are brought into contact with very small electrode pads made of aluminum to test electrical continuity, the probes are caused to slide on the pad surfaces to obtain electrical contact so as to break oxide films formed on the electrode pad surfaces. For this reason, large scars are formed on the pad surfaces after the inspection. In the future, in conjunction with the high integration of the semiconductor devices, a low-load inspection technique which does not cause damage to the electrode pads will be required in correspondence with a narrow-pitch inspection technique or the thin film electrode pads of the semiconductor devices.

As a conventional example of the probing inspection, a method disclosed in JP-A-1150863 is known. In this method, bridges with their both ends fixed to an upper surface of a board are formed, and probes are respectively formed on their centers, electrically conductive wiring being formed in such a manner as to extend from the respective probes.

In addition, a method disclosed in JP-A-8-75758 is also known. In this method, a probe is formed on a both-ends supported beam, and the probe is formed at a position orthogonally offset with respect to a longitudinal center line of the both-ends supported beam. It should be noted that this invention is used for a scanning probe microscope (SPM) and an information processing apparatus such as a recording and reproducing apparatus.

According to the above-described methods for inspecting semiconductor devices described in the related art, the following problems have been encountered.

With the former method, since a plurality of bridges are attached to the upper surface of the board, it is difficult to cope with products of narrow pitches. In addition, since the probe is formed at the center of the beam, if the probe is pressed against the electrode pad, the pressing force acts only in the vertical direction, so that it can be estimated that the probe is unable to brake an oxide film formed by alumina or the like and formed on the surface of the electrode pad formed of an aluminum material, with the result that the resistance value becomes large, making it impossible to obtain satisfactory continuity.

With the latter method, because of the position where the probe is formed and because the beam is formed of a separate member on a silicon board, the area for forming the probe becomes large, and much time and trouble is required for positioning the probe with high accuracy and fixing it. Hence, it can be estimated it is difficult to cope with the tendency toward formation of narrower pitches, and that the production yield is low. In addition, since two kinds of electrodes are formed on the beam to warp the beam, even if a plurality of probes are formed, the variation of the height of the probes will become large, so that it can be estimated that the probes cannot be formed at a fixed height, and the structure is complicated.

Further, with this method, since the number of probes provided is only one, and due to the fact that the probe is used in contact, and the method is not for use in the case where a plurality of probes are formed, it can be estimated that the structure is not such that, for example, the contact with electrode pads is assumed.

SUMMARY OF THE INVENTION

Accordingly, it is an object of the invention to realize a semiconductor inspecting apparatus which is capable of allowing probes to reliably come into contact with electrode pads formed on, for example, a semiconductor device for inspection at narrow pitches in the electrical characteristic inspection of the semiconductor device, and which is capable of increasing the probe life remarkably with a low pressing force and without forming unnecessary scars on the electrode pads, thereby overcoming the above-described numerous problems.

Another object of the invention is to provide a method for manufacturing a semiconductor inspecting apparatus and a method for inspecting a semiconductor device which are capable of improving the production yield, reducing the manufacturing cost, and consequently making it possible to obtain highly reliable semiconductor devices at low cost.

To attain the above objects, a structure adopted is such that in order to cause probes respectively formed on a plurality of beams formed on a first board of a plurality of electrical connection boards arranged in an inspecting apparatus to be individually brought into direct contact with a plurality of electrode pads of a semiconductor device for inspection so as to inspect the semiconductor device while establishing electrical connection therebetween, wherein each of the probes formed on the first board is formed substantially on a longitudinal center line of each beam and at a position offset from a point of application of a force of the beam, and wiring is connected continuously from the probe to a secondary electrode pad portion through an insulating layer.

It should be noted a structure is preferable in which a both-ends supported beam is used as each of the beams, and each of the probes is formed at a position offset from a longitudinal center of the both-ends supported beam toward one one longitudinal side of the both-ends supported beam. The probes which are brought into contact with electrode pads for inspection are capable of absorbing the variation of the height of the individual electrode pads and of establishing reliable contact with the electrode pads while scraping the surfaces of the electrode pads, thereby making it possible to obtain satisfactory contact resistance.

In addition, by adopting a structure such that a cantilever is used as each of the beams, and each of the probes is formed at a position offset in a direction perpendicular to a longitudinal center line of the cantilever, inclination may be added in the rotating direction in a case where the probe is brought into contact with the electrode pad. It should be noted that a predetermined angle may be provided for the surface of the center beam of the tip of each probe.

By adopting a structure such that each of the probes has an inclination of 45 degrees or more with respect to a vertical direction so as to be brought into contact with the electrode pad, the effect of scraping the surface of the electrode pad is enhanced, and it is possible to obtain satisfactory contact resistance. Hence, since satisfactory contact resistance can be obtained under a low pressing force, scars imparted to the electrode pads are shallow.

In addition, a manufacturing process is adopted which comprises the steps of: forming probes of silicon; patterning a compensation pattern for the probes by using a photolithographic process; forming the probes by wet etching; forming multilayer mask patterns by using the photolithographic process; processing reverse sides of the beams by wet etching; and forming the first board by using means for forming the beams by dry etching.

This manufacturing process is a process to process grooves with a high aspect ratio by dry etching after effecting processing by using wet etching excelling in mass productivity so as to allow the probes arranged at narrow pitches or at a high density to be separated at the individual beams.

By adopting a method for inspecting a semiconductor device by causing a plurality of probes respectively formed on a plurality of beams of a first board of a plurality of electrical connection boards arranged in an inspecting apparatus to be individually brought into direct contact with a plurality of electrode pads of a semiconductor device for inspection while establishing electrical connection therebetween, comprising the step of: effecting electrical inspection while causing each of the probes to wipe a surface of each of the electrode pads of the semiconductor device, a method of contact becomes possible in which scars on the electrode pads are small and a low pressing force is applied, and which gives low damage.

Further, by using the above-described structure and process, even if the electrode pads have oxide films formed thereon with a thickness of several angstroms, it becomes possible to establish reliable contact. Consequently, the inspected semiconductor devices or electronic parts can be provided at very low cost.

BRIEF DESCRIPTION OF THE DRAWINGS

FIG. 7 is an explanatory diagram concerning contact resistance and a contact area;

FIG. 8A is a detailed view in a case where the tip of the probe is acute-angled;

FIG. 8B is detailed view in a case where the tip of the probe is round;

FIG. 17A is a cross-sectional view taken along the X direction shown in FIG. 3B;

FIG. 17B is a cross-sectional view taken along the Y direction shown in FIG. 3B;

FIG. 18 is a diagram illustrating the process for manufacturing a structure in accordance with the embodiment of the invention.

DESCRIPTION OF THE EMBODIMENTS

Referring to FIGS. 1 to 18, a description will be given of the embodiments of the present invention.

Figure 1:
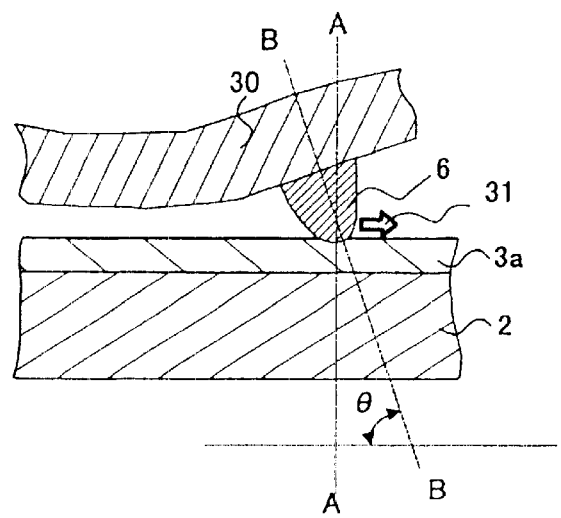
FIG. 1 is a cross-sectional view of an embodiment of the invention.

FIG. 1 shows a diagram explaining a typical embodiment of the present invention. A plurality of electrode pads 3a for inspection measuring several dozen micrometers square ($\mu m^2$) are formed on a subject wafer 2 with semiconductor devices formed thereon. FIG. 1 shows one portion thereof in enlarged form. Probes 6 formed on a beam or thin film 30 are each arranged to be brought into contact with the electrode pad 3a at an angle of θ. Namely, the structure provided is such that the probe formed on the beam or thin film is brought into contact with the electrode pad at an angle (center line B—B in the drawing) with respect to a perpendicular direction to the plane of the electrode pad (center line A—A in the drawing), and a tip of the probe moves (wipes) on the surface of the electrode pad as indicated by arrow 31. By adopting this structure, even in the case of electrode pads with an oxide film or contaminants formed on its surface, if a force is applied, the oxide film or the contaminants can be removed as the probe moves on the contact surface of the electrode pad, so that the probe is able to establish good contact with the electrode pad, and the value of electric resistance becomes small. By using a both-ends supported beam as the aforementioned beam and by using a structure in which the probe is provided independently on each both-ends supported beam or a number of probes are independently provided independently as a unit thereon, the variation of the height for the electrode pads for inspection is absorbed, and the probes are caused to scrape the surfaces of the electrode pads, thereby making it possible to obtain satisfactory continuity.

In addition, even if the probe is formed perpendicularly to the electrode pad surface, it is possible to adopt a method in which, by providing the position of the electrode pad portion in an offset manner, the angle of contact with the probe is changed to wipe the electrode pad surface. Namely, the arrangement provided is such that by providing the position of the probe in such a manner as to offset from the center of application of the force of the both-ends supported beam toward one supported portion side of the beam, even if a force is applied, the tip of the probe is directed toward the center of application of the force.

This embodiment provides a method whereby in a case where the probe and the electrode pad are brought into contact with each other, by adopting a mechanism or a structure in which either one of them moves by about several micrometers ($\mu m$), the probe and the electrode pad can be brought into contact with each other satisfactorily so as to reduce the value of electrical resistance.

Figure 2:
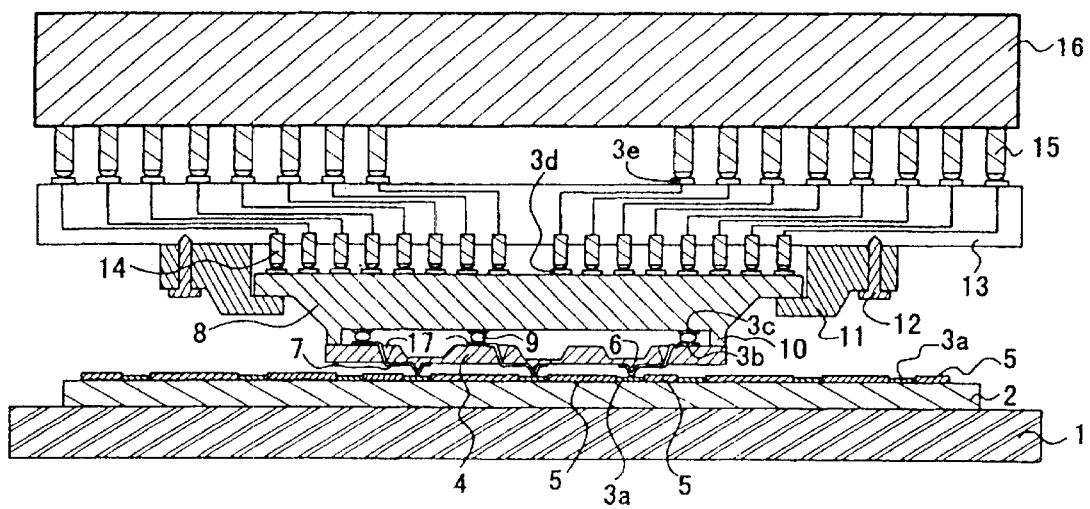
FIG. 2 is a schematic diagram of the apparatus in accordance with the embodiment of the invention.

Referring to FIG. 2, a description will be given of the structure of a wafer inspecting apparatus in accordance with the embodiment. As shown in FIG. 2, an easily deformable both-ends supported beam is formed on a probe forming board 4, and the probe 6 is formed on the both-ends supported beam. In the probe forming board 4, metal wiring 7 continues from the probe 6 to an electrode pad 3b formed on the surface of the probe forming board 4 opposite to its probe forming surface through a through hole 17 via an insulating layer. A detailed description will be given later of the probe forming board 4.

The probe forming board 4 is fixed to an electrical connection board 8 by means of solder balls 9. In this embodiment, the fixation and electrical connection of the probe forming board are effected simultaneously by using the solder balls. Incidentally, it is also possible to use a method in which, for example, silver paste, platinum paste, or a metallic material or a composite material which does not melt at 150° C. or less is formed by a screen printing process or the like and is subjected to baking to establish electrical continuity, so as to fix the probe forming board. Multilayer interconnections are formed inside the electrical connection board 8, and serve to expand electrode pads 3c arranged at narrow pitches to the interval between adjacent ones of POGO pins 14 arranged on top of the electrical connection board 8.

It should be noted that the electrode pads 3c formed on the electrical connection board 8 are formed in a matrix form at 800 $\mu m$ pitches. A ceramic is desirable as the material of this electrical connection board, and it is preferable to use mullite in the light of the coefficient of linear expansion. The reason for this is that since the burn-in inspection among various inspections is performed in the temperature atmosphere of 150° C., the material of the electrical connection board should preferably have a close coefficient of linear expansion in order to prevent the relative positional offset between the probes and the electrode pads of the subject wafer formed of silicon. In addition, projections 10 for preventing buckling are formed on the electrical connection board 8 so as to prevent the solder balls 9 from being crushed by more than fixed degrees by the pressing force which is applied during inspection.

The electrical connection board 8 and the probe forming board 4 are fixed to a multilayer interconnection board 13 through a jig 11 by means of bolts 12. It should be noted that, as the material of the jig, it is preferable to use a material whose thermal deformation at 150° C. or more is small, e.g., aluminum nitride or invar. The internal structure of the multilayer interconnection board 13 is such that multilayer interconnections are formed in glass fabric based epoxy resin, and a multiplicity of POGO pins 14 are formed and are connected to the internal multilayer interconnections. Incidentally, the POGO pin is an electrical continuity terminal provided with a spring mechanism. In a wafer inspecting apparatus 16, POGO pins or contact pins 15 which are used to establish electrical continuity with the multilayer interconnection board 13 are arranged at the intervals of electrode pads 3e of the multilayer interconnection board 13. In addition, as for the wafer inspecting apparatus 16, the method for establishing electrical continuity with the multilayer interconnection board 13 is not limited to the above-described method, and a connector or the like may be used if the method makes it possible to establish electrical connection.

As described before, the reason for interposing the two boards, i.e., the electrical connection board and the multilayer interconnection board, between the probe forming board and the wafer inspecting apparatus is that, in the case of the electrical connection board, since the multilayer interconnections are formed in the ceramic, the cost is very high, and a change of the board cannot be effected easily, so that in the case of a change in the inspecting system or a change of contacts the change can be effected by using the inexpensive multilayer interconnection board. In addition, when an application is made to other inspecting apparatus, the application can be easily made by changing the inexpensive multilayer interconnection board. It should be noted that, depending on the number of the electrode pads and the interval between the electrode pads, connection may be directly made to the multilayer interconnection board without using the electrical connection board.

The subject wafer 2 is fixed to a fixed stage 1 by means of a vacuum chuck. By using peripheral equipment, the fixed stage 1 employs a height controlling mechanism for controlling its height in units of several hundred micrometers (μm), and is structured so as to be capable of controlling the pressing force in units of several grams and of controlling its movement in the vertical, horizontal, and circumferential directions. Further, the fixed stage 1 is structured so as to be capable of bringing the electrode pads 3a formed on the subject wafer 2 and the probes 6 on the probe forming board 4 into contact with each other while positioning the electrode pads 3a and the probes 6 with high accuracy. In addition, although in the above-described structure the moving function for positioning is added to the fixed stage side, in this embodiment the moving function for positioning is not limited to the above-described structure, and the moving function for positioning may be added to the probe forming board side, or the moving functions for positioning may be added to both the probe forming board side and the fixed stage side.

Next, a description will be given of the structure concerning electrically conducting means for effecting the transfer of electrical signals between the wafer inspecting apparatus 16 and the subject wafer 2. Upon completion of the positioning between the subject wafer 2 and the probe forming board 4, if the two members are brought into contact with each other by using the above-described mechanism, the probe forming board is pressed against a surface protective film 5 of the subject wafer, such that the warp and inclination of the subject wafer are suppressed, the both-ends supported beam of the probe forming board is deflected upward, and a fixed pressing force is imparted to the electrode pads 3a by its reaction force. The pressing force necessary for electrical continuity in this embodiment was about 2 g or thereabouts. If the pressing force is higher than this level, satisfactory electrical continuity can be obtained. However, if the pressing force is excessively large, the pressing force causes damage to the electrode pads 3a.

It should be noted that electrode pads measuring approximately 80 microns square are formed on the subject wafer 2. The surface protective film 5 formed of a polyimide base resin is formed in the vicinities of the electrode pads to prevent faulty contact and the like. In addition, an insulating film 18 formed of polyimide or the like is formed on the wiring other than the electrode pads 3b and the probes 6 in such a manner as to fill the steps of the wiring. Further, as the insulating film on the surface of the probe forming board, another insulating material may be used if it does not cause damage to the surface protective film 5 and is capable of withstanding temperatures higher than at least 150° C. In addition, as for the wiring, a structure may be adopted in which grooves are formed in the probe forming board, and the wiring is embedded in the grooves.

The electrode pads 3a are made to electrically conduct by coming into contact with the probes 6 on the probe forming board 4. The metal wiring is formed in such a manner as to continue from each probe on the probe forming board 4 to the respective electrode pad 3b formed on the surface of the probe forming board opposite to its probe forming surface. The electrode pads 3b on the probe forming board and the electrode pads 3c on the lower surface of the electrical connection board 8 are respectively electrically connected to each other through the solder balls. The electrode pads 3c on the lower surface of the electrical connection board 8 and electrode pads 3d on the upper surface thereof are provided with electrical connection by multilayer interconnections formed inside the electrical connection board. The transfer of electrical signals between the electrode pads 3d on the upper surface of the electrical connection board 8 and the multilayer interconnection board 13 is effected by using the POGO pins.

Since the POGO pin incorporates a spring mechanism, electrical connection c an be obtained reliably without causing faulty conduction even if waviness or the like has occurred on the board. In addition, since the POGO pins are adopted for this portion, even if the object of inspection has been changed, the electrical connection board and portions located therebelow can be easily replaced. The POGO pins arranged on the multilayer interconnection board 13 are connected to the electrode pads 3e formed on the upper surface of the multilayer interconnection board by means of the internal wiring in the multilayer interconnection board. Further, for the final transfer of electrical signals with respect to the wafer inspecting apparatus 16, the POGO pins or contact pins 15 formed in the inspecting apparatus are used.

By using the various boards arranged as described above, it becomes possible to transfer electrical signals from the electrode pads on the subject wafer to the inspecting apparatus. In addition, since the electrical connection board and portions located therebelow can be easily replaced depending on inspecting apparatus for various inspections as described above, the semiconductor inspecting apparatus of this embodiment can be applied to various inspecting methods including the probing inspection in which whether electrical continuity between circuits is good or bad is determined by a driving frequency of 30 MHz, the burn-in inspection in which failures are checked under acceleration by imparting thermal and electrical stresses to the circuits at a driving frequency of 5 MHz and at a high temperature of 150° C. or thereabouts for several hours to several dozen hours, and the final inspection in which inspection is finally performed by a high driving frequency of 133 MHz or higher.

Thus, the semiconductor inspecting apparatus of this embodiment can be used not only in the above-described probing inspection but also in other inspecting methods. For example, this semiconductor inspecting apparatus can be also used in a case where the burn-in inspection is performed to continuously inspect the electrical characteristic inspection at the wafer level in a packed state, since reliable contact between the electrode pads and the probes can be obtained. In addition, the wiping effect similar to that of this embodiment can be obtained even if a mechanism capable of slightly moving the entire subject wafer by several micrometers (μm) or thereabouts is installed at a peripheral portion of the subject wafer, or a mechanism capable of slightly moving the entire subject wafer by several micrometers (μm) or thereabouts is installed on the probe side, e.g., if a structure is provided such that a piezoelectric element is installed on a side surface of the subject wafer to allow the entire subject wafer to be moved after the contact.

Figure 3A:
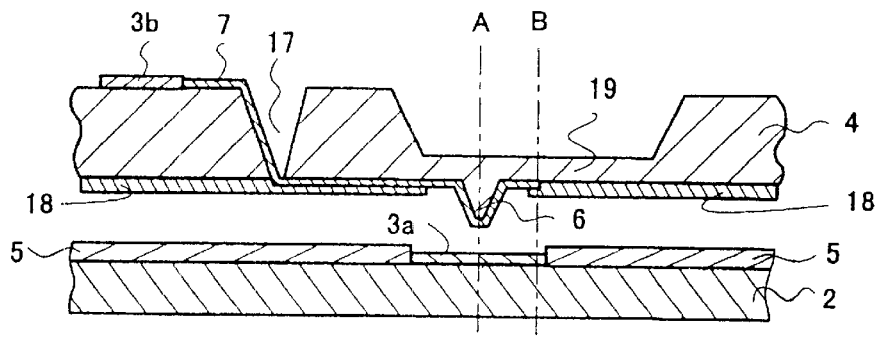
FIG. 3A is a cross-sectional view of the embodiment of the invention.
Figure 3B:
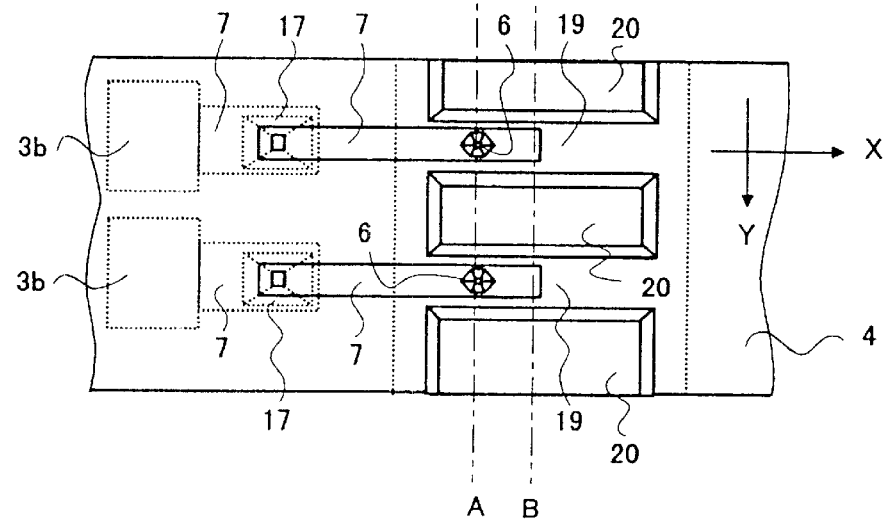
FIG. 3B is a plan view of the embodiment of the invention.

Next, referring to FIGS. 3A, 3B and 4, a description will be given of a detailed structure of the probe forming board. FIGS. 3A and 3B illustrate detailed diagrams of the probe forming board, in which FIG. 3A shows a cross-sectional view, and FIG. 3B shows a plan view of the probe forming board as viewed from the probe side. The probe forming board 4 is formed of a silicon material, and includes a both-ends supported beam 19 and the probe 6 formed on the both-ends supported beam, the both-ends supported beam 19 and the probe 6 being formed by the micromachining technology. As shown at the center line A—A in FIGS. 3A and 3B, the position of the probe is processed at the same position as the center position of the electrode pad 3a formed on the subject wafer 2. It should be noted that the surface portion of the subject wafer 2 other than the surface portion where the electrode pads 3a are formed is formed by the surface protective film 5 in such a manner as to be several microns higher than the electrode pads. The position of the probe is formed at the position of the center line A—A offset from the center line B—B which is at the longitudinal center of the both-ends supported beam (i.e., at a position closer to one supporting side of the both-ends supported beam). It should be noted that the probe is formed at a center in a direction perpendicular to the longitudinal direction of the both-ends supported beam (i.e., at a center in the widthwise direction of the beam). The plurality of pieces of the metal wiring 7 are connected from the probes 6 to the electrode pads 3b formed on the reverse side of the probe forming board 4 through the through holes 17 formed in the probe forming board 4. It should be noted that the protective film 18 is formed on the surface of the wiring 7.

The relative positional accuracy of the silicon probes in this embodiment is extremely good since processing is effected by making use of the micromachining technology. Their positional accuracy depends on the mask accuracy. The general mask accuracy is ±1 μm or less, and the relative positional accuracy of the probes which are processed also falls within that range. As shown in FIG. 3B, the probes 6 are respectively formed on the both-ends supported beams 19 at the same positions as the electrode pads on the subject wafer, and spaces 20 are respectively formed in the vicinities of the beams. In addition, the reason that the both-ends supported beam 19 is formed for each probe is to impart a pressing force to the electrode pad individually. It should be noted that the X direction and the Y direction shown in the plan view of FIG. 3B indicate cross-sectional directions as viewed in the plan view. The cross-sectional views which are shown below will be described by using these directions as references.

Figure 4:
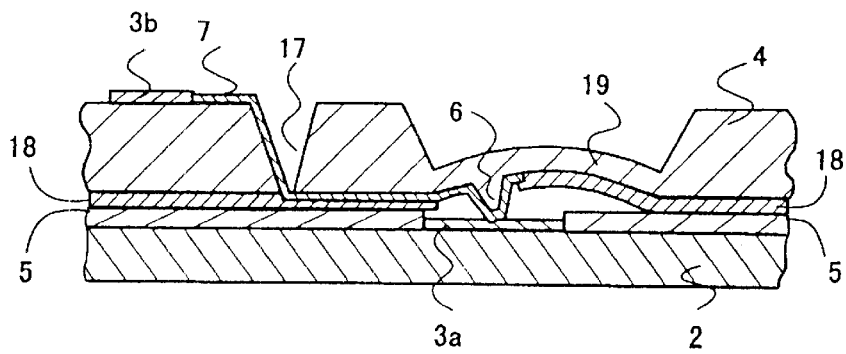
FIG. 4 is a cross-sectional view illustrating a probe and an electrode pad in accordance with the embodiment of the invention.

FIG. 4 shows an explanatory diagram in a case where the structure shown in FIGS. 3A and 3B is actually brought into contact with the electrode pad. In the drawing, if the probe forming board 4 is brought into contact with the electrode pad 3a of the subject wafer 2, the both-ends supported beam 19 becomes deformed while depicting an arc. At this time, since the probe 6 is disposed by being offset toward one supported portion of the both-ends supported beam, the probe 6 comes into contact with the electrode pad 3a diagonally, and slightly moves toward the center of the beam.

Figure 5A:
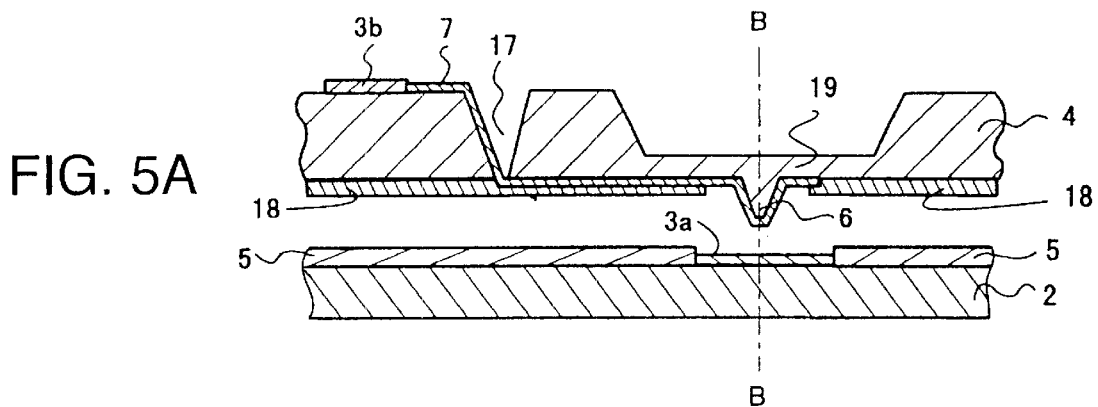
FIG. 5A is a cross-sectional view before contact with the electrode pad when a probe s provided at the middle of a beam.
Figure 5B:
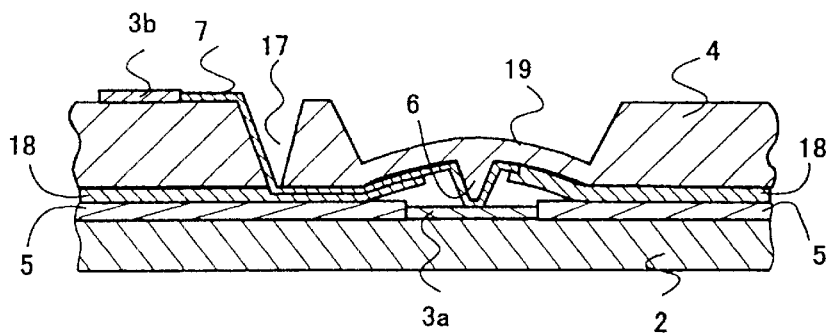
FIG. 5B is a cross-sectional view at the time of contact with the electrode pad when a probe is provided at the middle of a beam.

Meanwhile, FIGS. 5A and 5B show cross-sectional views in a case where the probe is formed at the center of the beam. It should be noted that the cross-sectional direction of the drawing shows the X direction shown in the plan view in FIG. 3B. FIG. 5A shows a cross-sectional view before contact with the subject wafer, while FIG. 5B shows a cross-sectional view after the contact. In the cross-sectional view of FIG. 5A, the probe 6 is formed at the center of the both-ends supported beam 19 formed on the probe forming board 4. The electrode pad 3a is similarly formed at the position of the center of the probe. If this structure is brought into contact, the beam is deflected in such a manner as to depict an arc, as shown in FIG. 5B. The probe 6 comes into contact with the electrode pad perpendicularly. With this structure, the pressing force against the electrode pad acts only in the downward direction. On the other hand, with the structure shown in FIG. 4, the force acts not only in the downward direction but also in the lateral direction. By using such a structure, it is possible to obtain a satisfactory contact with respect to the electrode pad with a shallow scar and with a low pressing force. A description of the details will be given later.

Figure 6:
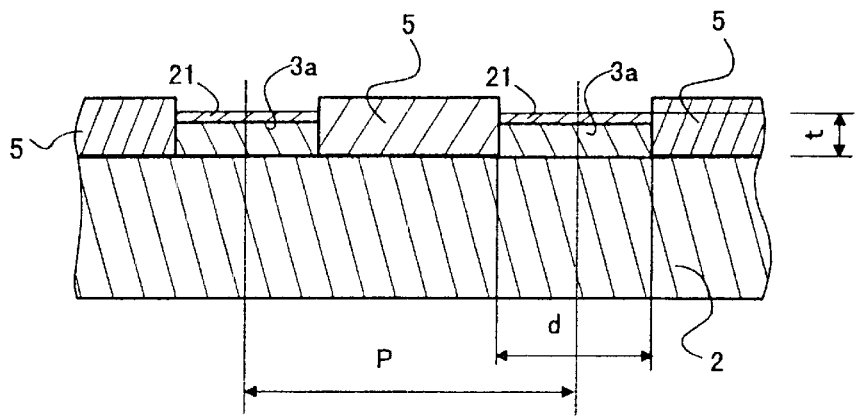
FIG. 6 is a detailed diagram of a semiconductor wafer.

With the electrode pads for inspection in semiconductor devices, miniaturization is increasingly under way in conjunction with the tendency toward higher densities of the semiconductor devices. Referring to FIG. 6, a description will be given of the structure of the miniaturized electrode pads. In FIG. 6, the thickness t of the electrode pads 3a formed on the subject wafer 2 is tending to be increasingly thinner, and the width d of the electrode pads is tending to be increasingly narrower. Further, the interval P of the electrode pads is also tending to be formed at an increasingly narrower pitch. It should be noted that in a case where aluminum or a similar material is used as the electrode pads 3a, oxides 21 are formed on their surfaces. By taking into the above-described factors, as for the probes which are brought into contact with the electrode pads, it is necessary to adopt a low-damage inspection method which imparts a small pressing force and does not form a large damage. This is because if the contact resistance is large, the inspection cannot be performed at a target driving frequency.

Here, a description will be given of the relationship between, on the one hand, the contact resistance between the very small probe and the electrode pad and, on the other hand, the area of the tip of the probe or the contact area. FIG. 7 shows a diagram of the relationship in a case where an oxide has been formed on the surface of the electrode pad. Generally, in order to lower the contact resistance, the larger the area of contact with the electrode pad, the better. However, if it is assumed that pressing is effected with an identical pressing force, the smaller the area of the tip of the probe, the more the contact resistance declines. This is because, under the same pressing force, the smaller the area of the tip of the probe, the more the surface pressure increases, so that even if an oxide film or the like has been formed on the surface of the electrode pad, the oxide film or the like can be easily broken.

Referring to FIGS. 8A, 8B to 14, a more detailed description will be given. FIG. 8A shows a case where the tip area 22a of the probe 6 formed on the beam or thin film 19 is small, while FIG. 8A shows a case where the tip area 22b of the probe 6 formed on the beam or thin film 19 is large. Examples in which such two kinds of probes are perpendicularly pressed against the electrode pad surface of the subject wafer are shown in FIGS. 9A and 9B. In FIG. 9A, since the tip area of the probe is small, the oxide film 21 formed on the surface of the electrode pad 3a can be easily broken, so that it is possible to obtain a sufficient portion of contact 23a with the material of the electrode pad 3a.

Figure 9A:
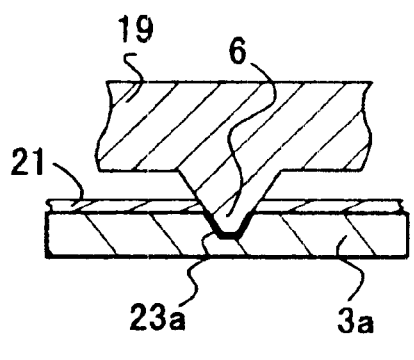
FIG. 9A is a diagram illustrating a state of contact with the electrode pad in the case where the tip of the probe is acute-angled.
Figure 9B:
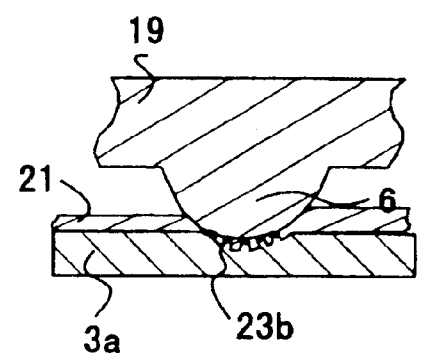
FIG. 9B is a diagram illustrating a state of contact with the electrode pad in the case where the tip of the probe is round.

Meanwhile, in FIG. 9B, since the tip area of the probe is large, the oxide film 21 formed on the surface of the electrode pad 3a cannot be broken. For this reason, it is impossible to obtain a sufficient portion of contact 23b with the material of the electrode pad 3a, and the contact resistance becomes large. Consequently, under the identical pressing force, the larger the tip area of the probe, the more the contact resistance increases, as shown in FIG. 7.

Figure 10:
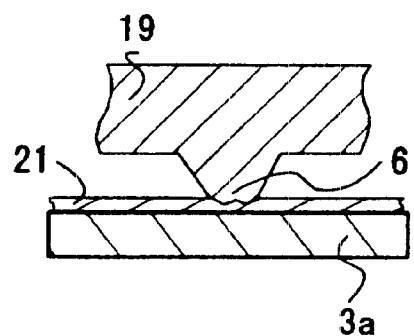
FIG. 10 is a diagram explaining the life.

On the other hand, as the probes for inspection, it is necessary to take into account their life depending on the product. For example, in the case of the burn-in inspection several hundred times of contact is considered necessary, while in the case of the probing inspection about 200,000 times of contact is considered necessary. For this reason, in the case where the tip area is small, if the number of times of use increases, the tip portion of the probe 6 becomes crushed as shown in FIG. 10, with the result that the oxide film 21 of the electrode pad 3a cannot be broken, so that there is a problem in that satisfactory contact resistance cannot be obtained.

Figure 11A:
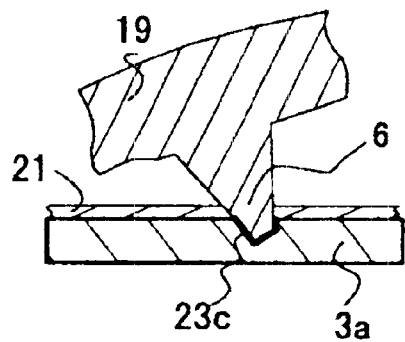
FIG. 11A is a diagram illustrating a state immediately after the probe has come into contact with the electrode pad in accordance with the embodiment of the invention.

In this embodiment, in view of these aspects, an inspection method is provided which gives low damage to the electrode pad with a low pressing force by causing the probe to come into contact with the electrode pad obliquely to wipe the surface of the electrode pad. More specifically, by adopting a structure in which the probe 6 formed on the beam or thin film 19 is caused to come into contact with the electrode pad 3a obliquely, as shown in FIG. 11A, the contact area c increases, so that the oxide film 21 can be easily broken, and the contact resistance at that time also declines. In terms of the shape of the tip of the probe, a number of ridge lines are formed from the tip of the probe toward the base of the probe. Namely, a probe structure in which corners have been formed is likely to break the oxide film, and is therefore preferable.

Figure 11B:
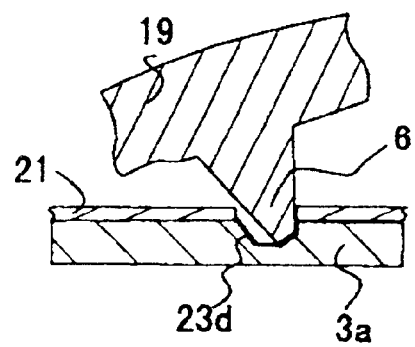
FIG. 11B is a diagram illustrating a state immediately after the probe came into contact with the electrode pad and wiped it in accordance with the embodiment of the invention.

To further lower the contact resistance, as shown in FIG. 11B, by causing the probe to effect wiping after coming into contact with the electrode pad, it is possible to increase the contact area while removing the oxide film, and it is possible to lower the contact resistance more reliably.

Figure 12A:
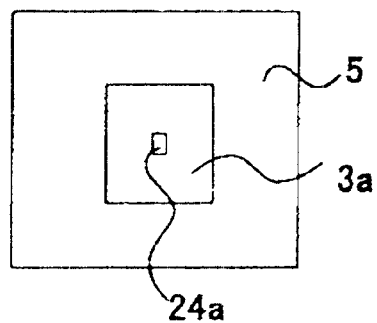
FIG. 12A is a diagram illustrating a probe impression immediately after the probe in accordance with the invention has come into contact.
Figure 12B:
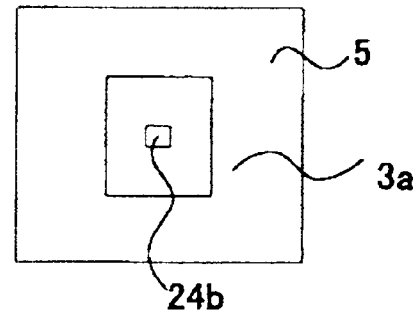
FIG. 12B is a diagram illustrating a probe impression after the probe in accordance with the invention came into contact and effected wiping.

FIGS. 12A and 12B show a probe impression at that time. The protective film 5 is formed around the electrode pad 3a. FIG. 12A corresponds to FIG. 11A, while FIG. 12B corresponds to FIG. 11B. If a comparison is made between the two, it can be seen that a probe impression 24b has been formed widely after wiping as compared with a probe impression 24a.

This embodiment particularly produces an effect of lowering the contact resistance of a metal electrode pad formed of aluminum with an oxide film formed on its surface, or solder or its alloy where an oxide film is likely to be formed on its surface. In addition, since an attempt is made to obtain satisfactory continuity by scraping the electrode pad surface shallowly instead of making a deep scar on the electrode pad, the present invention is a low-damage inspection method. For instance, even with respect to electrode pads formed of a metal on which a surface oxide film is unlikely to be formed, inspection with an even lower pressing force is made possible, so that the present invention is extremely effective.

In addition, as for the amount of wiping in this embodiment, an amount of movement of several micrometers or thereabouts produces an effect. According to an experiment, by using silicon-made probes provided with metal wiring, an experiment was performed by setting the tip area to 90 square micrometers ($\mu m^2$) and by setting the pressing force of the individual probes to 5 g, and the result was that the contact resistance was 1 $\Omega$ or less at a 3 $\mu$m wiping.

Figure 13:
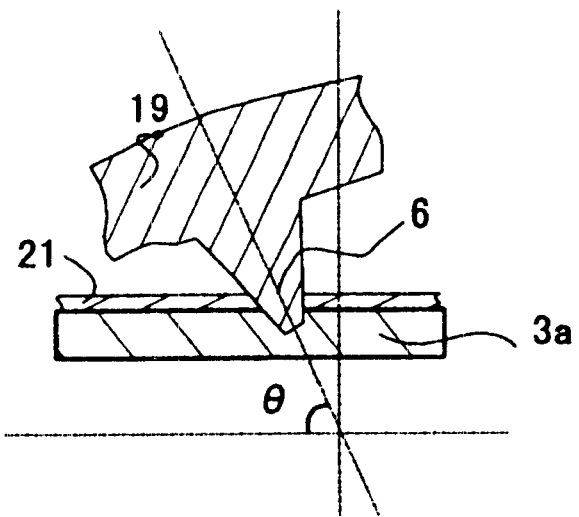
FIG. 13 is diagram explaining a state of contact of the probe in accordance with the invention.
Figure 14:
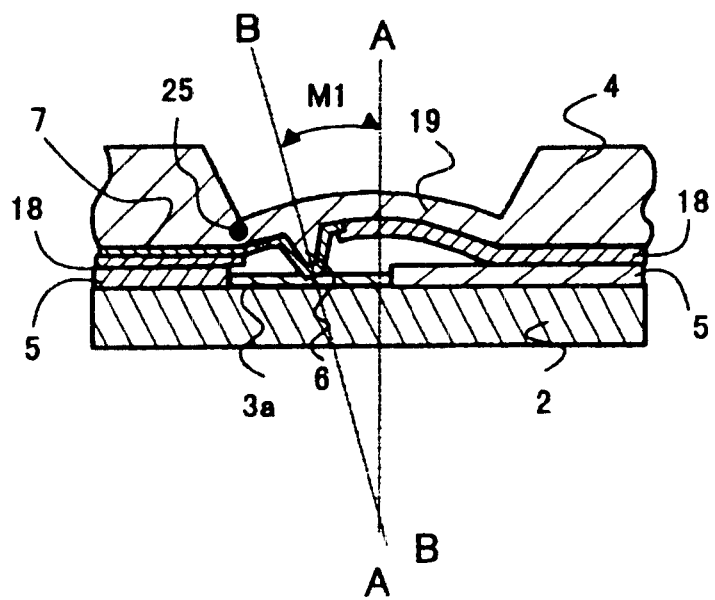
FIG. 14 is a cross-sectional view in accordance with the embodiment of the invention.

Referring to FIG. 13, a description will be given of the depth of the probe impression in this embodiment. Generally, with the structure shown in FIG. 9A, in the case where the thickness of the electrode pad is small, if the pressing force is increased, the probe pierces through the electrode pad. For this reason, it is necessary to cause the probe to come into contact with the electrode pad with a low pressing force, but if the tip of the probe is formed to be very small to obtain sufficient contact resistance, this structure has a short life as described above. In this embodiment, the probe 6 formed on the beam or thin film 19 is brought into contact with the electrode pad with an angle of θ with respect to the horizontal surface of the electrode pad. If the angle of θ is 45 degrees, the downwardly acting pressing force and the laterally acting pressing force assume the same magnitudes. If the angle of θ is less than 45 degrees, the laterally acting pressing force becomes stronger than the downwardly acting pressing force, whereas if the angle of θ is more than 45 degrees, the downwardly acting pressing force becomes stronger than the laterally acting pressing force. Namely, in order to allow the probe to come into contact with the electrode pad and effect wiping, it is preferable to set the angle of θ at less than 45 degrees.

On the other hand, the position where the probe is formed on the beam or the like is limited. A description will be given with reference to FIG. 14. In a case where the probe is formed by offsetting the position by the length of M1 from the center line A—A at the center of the beam to the center line B—B, a stress acts on a fulcrum 25 of the beam on the side where the probe is formed in the both-ends supported beam, and it becomes difficult to form the probe excessively close to the fulcrum 25. For this reason, the position of the probe needs to be formed by taking into account the material, the shape of the beam, and the like. Basically, the position of the probe can be calculated by a formula which is described in documents on the strength of materials and the like. In the aforementioned structure shown in FIG. 14, in the case where silicon is used as the material of the beam, the amount of displacement of the probe is 10 $\mu$m, the thickness of the beam is 28 $\mu$m, and the length of the beam is 1 mm, the position of the probe can be offset by a maximum of 120 $\mu$m or thereabouts from the center of the beam.

Figure 15A:
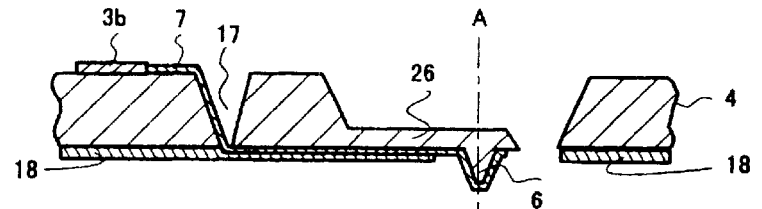
FIG. 15A is a cross-sectional view in accordance with another embodiment of the invention.
Figure 15B:
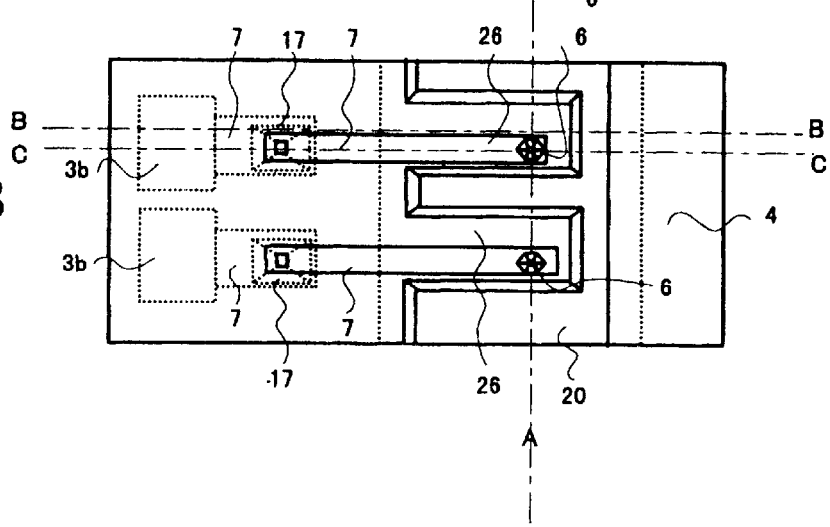
FIG. 15B is a plan view in accordance with the other embodiment of the invention.

Another embodiment of the invention is shown in FIGS. 15A and 15B. FIG. 15A shows a cross-sectional diagram of a cantilever, and FIG. 15B shows a plan view thereof. Cantilevers 26 and the through holes 17 are formed in the probe forming board 4. The probe 6 is formed on each cantilever 26, and its position is formed on the center line C—C at a position offset from the center line B—B at the longitudinal center of the cantilever. In a case where the probe thus formed is brought into contact with the electrode pad, the probe can be brought into contact with the electrode pad satisfactorily while forming a twist. It should be noted that the reference numeral 20 indicates a space, and the wiring 7 continues from the probe 6 to the electrode pad 3b through the through hole 17.

The structure for causing each probe to effect wiping in this embodiment can be provided with the effects of wiping, rotation, and the like since the position of the probe is basically formed at a position offset from the longitudinal center and a central position in a direction perpendicular to the longitudinal direction. In addition, it is not necessarily essential for the probe to be structured integrally with the beam. For example, it is possible to use a structure in which only the probe is formed by an impression after the formation of the beam.

Figure 16A:
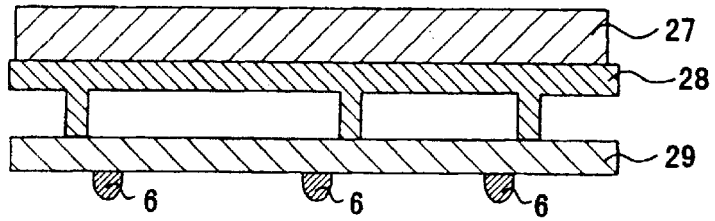
FIG. 16A is a cross-sectional view in accordance with still another embodiment of the invention.
Figure 16B:
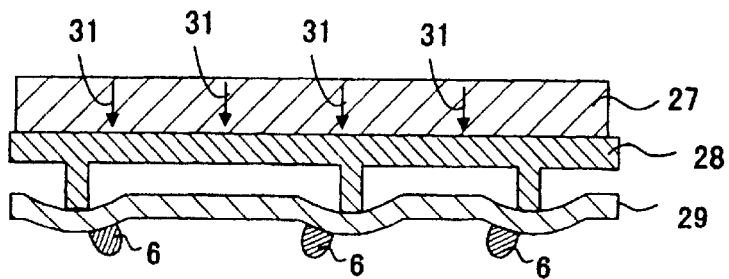
FIG. 16B is a cross-sectional view after a force has acted in accordance with the other embodiment of the invention.

FIGS. 16A and 16B are diagrams explaining still another embodiment of the invention. FIG. 16A shows a state before pressing, while FIG. 16B shows a state after pressing. The probes 6 are formed on a sheet material 29 which is easily deformable and in which wiring is formed in its interior. If a pressing jig 28 is pressed by a pressing mechanism 27 in the direction of arrows 31, the pressing jig 28 deforms the sheet material 29 as shown in FIG. 16B, with the result that the probes 6 come into contact with the electrode pads (not shown) in an obliquely maintained state, and are able to effect wiping. In addition, without using the pressing mechanism 27, it is possible to use a structure in which the overall unit is hermetically sealed by such as a vacuum pack, and pressing is effected in a vacuum.

Meanwhile, referring to FIGS. 17A and 17B, a description will be given of a method forming the probes with narrow pitches. FIG. 17A shows a cross-sectional view taken along the X direction in the cross-sectional directions shown in FIG. 3B, while FIG. 17B shows a cross-sectional view taken along the Y direction. In a case where silicon is processed into the material, the structure is generally formed by using the technique of silicon's anisotropic etching. This is because the technique of silicon's anisotropic etching excels in the mass productivity since it is wet etching. In this technology, if etching is provided on the (100) crystal planes at positions other than those provided with masking, the etching rate is delayed only at the {111} crystal planes, and a structure surrounded by the (100) crystal planes 33 and the {111} crystal planes is finally formed. For this reason, as shown in FIG. 17(*b*), the height M of the beam and the probe combined and the pitch P between the probes can be expressed by Formula (1) below.

$$P = 2M/\sqrt{2} \qquad (1)$$

For example, if the height M of the bean and the probe combined is set to 30 μm thickness by using a silicon wafer, the minimum pitch between the probes becomes 42.4 μm, and at a pitch smaller than this pitch it is difficult to form individually independent beams.

Accordingly, referring to FIG. 18, a description will be given of a manufacturing process which permits processing at a narrow pitch and excels in the mass productivity. FIG. 18 explains processing steps using the micromachining technology in the formation of the probe forming board which has been described above. It should be noted that a cross-sectional view taken along the X direction shown in FIG. 3B is shown on the left-hand side of the broken line A—A in FIG. 18, while a cross-sectional view taken along the Y direction shown in FIG. 3B is shown on the right-hand side thereof.

In FIG. 18, a silicon wafer 34 of the (100) direction with a thickness of 500 μm was first prepared, as shown in FIG. 18(*a*). Next, a thermal oxide film with a thickness of 0.5 μm was formed, a resist was coated on a thermal oxide film 35 formed on the surface of the silicon wafer 34, and pattern exposure, development, and etching of the thermal oxide film were performed from one side, thereby forming a mask pattern for forming the probes 6. To obtain a target probe dip shape, a compensation pattern for coping with the corner cutting due to etching was formed in the configuration of the mask pattern. Subsequently, anisotropic etching for 20 μm steps was performed from one side by using an aqueous solution of potassium hydroxide at 70° C., thereby forming the probes 6, as shown in FIG. 18(*b*). At this time, slanting surfaces formed of the {111} crystal planes 32 were formed on the probe forming portion.

In the etching of silicon, it is possible to use not only the aqueous solution of potassium hydroxide but also other wet etching solutions, e.g., ethylenediamine pyrocatechol, tetramethylammonium hydroxide, and hydrazine. Further, a multilayer masking method is used for collectively etching holes of different depths with time differences.

As shown in FIG. 18(*c*), oxidation, resist coating, pattern exposure, development, etching of the thermal oxide film, and oxidation were effected repeatedly by using a photolithographic process. More particularly, after the formation of the oxide film, patterning was consecutively effected starting with shallow holes. It should be noted that there were three different kinds of holes in the probe forming board of the structure shown in FIG. 18. First, an oxide film 35 was formed, and patterning was effected for separating the probes. Both-surface oxidation was then effected to form oxide films 35*b*, and patterning was performed to etch the beams to a predetermined thickness. Both-surface oxidation was then effected to form oxide films 35*a*.

As shown in FIG. 18(*d*), after effecting the patterning of deepest etching holes 37*a*, anisotropic etching was effected halfway. As shown in FIG. 18(*e*), the oxide films 35*a* in the second deepest holes were removed, and simultaneous anisotropic etching was further effected for processing first and second holes 37*b* down to predetermined depths. Then, as shown in FIG. 18(*f*), after removing the oxide films 35*b*, dry etching was effected from the direction shown at arrows 31 by using the oxide films 35*c* as the masking material, thereby effecting the processing of the space 20 surrounded by vertical walls.

Consequently, the probes 6 and the both-ends supported beams 19 were individually separated. At this time, it was possible to process the beams with a beam thickness of 30 μm and a narrow pitch of 25 μm between the probes. Here, even if anisotropic etching is used instead of dry etching, it is possible to effect the separation processing of the beams, but since slanting surfaces are formed in the anisotropic etching as described above, it becomes difficult to form beams with a narrow pitch. As a processing apparatus for the aforementioned dry etching, etching for providing vertical walls with an aspect ratio of about 20 can be effected by using an inductively coupled plasma reactive ion etching (ICP-RIE) apparatus.

In the above-described technology, although a description has been given of the example in which the thermal oxide film was used as the masking material for anisotropic etching, a silicon nitride film or a composite film in which a silicon nitride film is formed on a thin thermal oxide film may be used as the masking material.

Subsequently, as shown in FIG. 18(*g*), after oxide films were formed on the overall surfaces of the structure, metallic thin films were formed on both sides by a sputtering apparatus, and the patterning of the metallic thin films was effected by a photolithographic process using an electrodeposition resist. Multilayer wiring 36 was then formed of copper and a nickel material by using a plating apparatus. As the metallic thin films using the sputtering apparatus, films were used in which Cr or Ti with a thickness of 20 nm was deposited and Au with a thickness of 1000 nm was laminated thereon. This Cr or Ti was formed to improve the adhesion between the board and Au. As the aforementioned wiring material, other material may be used insofar as it does not melt at 150° C. or lower and is capable of forming electrically conductive thin films.

As the apparatus used for wiring and the like, an apparatus other than the sputtering apparatus, e.g., a vapor deposition apparatus or a chemical vapor deposition (CVD) apparatus may be used. Further, the method of forming the wiring is not limited to the lift-off method, it is possible to adopt a method in which after thin films are formed on the overall surfaces of the board by using a resist capable of forming resist patterns three-dimensionally by using such as an electrodeposition resist or spray resist coating apparatus, photolithography is performed, etching is performed, and the wiring is subsequently formed by plating. Cu was formed thereon with a thickness of 10 μm, and Ni was further formed thereon with a thickness of 2 μm, thereby forming multilayer wiring 42 from the probes to the electrode pads.

As a result of applying the probe forming board of the above-described embodiments of the invention to the burn-in inspection, the contact resistance between the electrode pads of the subject wafer and the probe terminals was low at 2 Ω or less, and the 100 MHz or more was obtained as the test frequency. In addition, the life at that time was 20,000 times of contacts or more. At that time, although the temperature atmosphere was varied from room temperature to 150° C., very satisfactory contact was obtained between the electrode pads of the subject wafer and the probes. In addition, although in the embodiments a description has been given by using the wafer to be inspected as a subject, the invention can be also applied to the inspection of bare chips or the inspection of devices with solder balls formed thereon, for example.

In addition, the invention can be used particularly for the application of contacts to tape for sockets for burn-in. Devices such as semiconductor devices or semiconductor chips which are inspected by using the inspecting apparatus of the embodiments are able to produce products having low-damage electrode pads since scars on the electrode pads are shallow. for this reason, when solder balls are formed after the inspection, the solder balls can be formed satisfactorily, and the same electrode pads can be used at the time of other inspections as well.

As described above, it becomes possible to perform electrical inspection at narrow pitches and with high reliability, and the inspected semiconductor devices or electronic parts can be provided at very low cost.

By performing various inspections by using the inspecting apparatus to which the structure for causing the probes to wipe the electrode pad surfaces is applied, impressions of the probes upon the electrode pad portions are small, and contact can be established reliably, so that the reliability is high, and the inspecting time can be shortened. Further, by applying the processing technology coping with narrow pitches, the range of application to those products for which contact has been hitherto difficult expands. Additionally, the inspecting apparatus of the invention excels in the mass productivity, and it is possible to provide highly reliable semiconductor devices at low cost.

What is claimed is:

1. A semiconductor inspecting apparatus comprising:
a plurality of electrical connection boards arranged in said inspecting apparatus; and
a plurality of probes respectively provided on a plurality of beams formed on a first board of said plurality of electrical connection boards, each of said probes being adapted to be individually brought into direct contact with a respective ones of a plurality of electrode pads of a semiconductor device for inspection, so as to inspect the semiconductor device while establishing electrical connection therebetween,
wherein each of said beams is supported at opposite ends of a respective beam by said first board, and each of said probes is formed at a position offset with respect to a middle portion of respective ones of said beams toward a supported portion side of each of said beams.

2. The semiconductor inspecting apparatus according to claim 1, wherein each of said probes has an inclination of 45 degrees or more with respect to a horizontal surface of the electrode pad so as to be brought into contact with the electrode pad.

3. The semiconductor inspecting apparatus according to claim 1, wherein each of said probes is formed at a position along a longitudinal center of each of said beams.

4. The semiconductor inspecting apparatus according to claim 3, wherein each of said probes has an inclination of 45 degrees or more with respect to a horizontal surface of the electrode pad so as to be brought into contact with the electrode pad.

5. The semiconductor inspection apparatus according to claim 1, wherein a surface of respective ones of the electrical pads is wiped by respective probes by flexing of the beam with respect to the supported ends thereof.

6. A semiconductor inspecting apparatus comprising:
a plurality of electrical connection boards arranged in said inspecting apparatus; and
a plurality of probes respectively provided on a plurality of beams formed on a first board of said plurality of electrical connection boards, each of said probes being adapted to be individually brought into direct contact with a respective one of a plurality of electrode pads of a semiconductor device for inspection, so as to inspect the semiconductor device while establishing electrical connection therebetween,
wherein each of said beams is supported at opposite ends thereof by said first board and each of said probes is provided in such a manner as to be offset from a middle portion of each of said beams so that the beams flex with respect to the supported ends thereof.

7. A method for manufacturing a semiconductor inspecting apparatus including a plurality of electrical connection boards arranged in said inspecting apparatus and a plurality of probes respectively provided on a plurality of beams formed on a first board of said plurality of electrical connection boards, said probes being adapted to be individually brought into direct contact with respective ones of a plurality of electrode pads of a semiconductor device for inspection, so as to inspect the semiconductor device while establishing electrical connection therebetween, comprising the steps of:
patterning a compensation pattern for said probes by using a photolithographic process;
forming said probes by wet etching;
forming multilayer mask patterns by using the photolithographic process;
processing reverse sides of said beams by wet etching; and
forming said first board by using means for forming said beams by dry etching so that each of said beams is supported at opposite ends thereof by said first board, and each of said probe is formed at a position offset from a middle portion of each of said beams toward one of the supported ends.

8. A method for inspecting a semiconductor device by causing a plurality of probes respectively formed on a plurality of beams of a first board of a plurality of electrical connection boards arranged in an inspecting apparatus to be individually brought into direct contact with respective ones of a plurality of electrode pads of a semiconductor device for inspection while establishing electrical connection therebetween, wherein each of said beams is supported at opposite ends thereof by said first board, and each of said probe is formed at a position offset from a middle portion of each of said beams towards one of the supported ends, comprising the step of:
effecting electrical inspection while causing each of said probes to wipe a surface of each of the electrode pads of the semiconductor device.

9. A semiconductor inspecting apparatus comprising:
a plurality of electrical connection boards arranged in said inspecting apparatus; and
a plurality of probes, each of said probes being provided on respective ones of a plurality of beams formed on a first board of said plurality of electrical connection boards, each of said probes being adapted to be individually brought into direct contact with a plurality of electrode pads of a semiconductor device for inspection, so as to inspect the semiconductor device while establishing electrical connection therebetween,
wherein each of said beams is supported at opposite ends thereof by said first board, and each of said probes is formed at a position offset from a middle portion of each of said beams toward one of the supported ends.

10. The semiconductor inspecting apparatus according to claim 9, wherein for inspection, said first board has a surface thereof which moves toward said semiconductor device so that the surface of said first board contacts said semiconductor device at a portion other than respective ones of said electrode pads.

11. The semiconductor inspecting apparatus according to claim 9, wherein each of said beams has a thickness which is thinner than a thickness of said first board.

12. The semiconductor inspecting apparatus according to claim 9, wherein a single one of said probes is formed on a respective one of said beams.

* * * * *